United States Patent
Mo et al.

(10) Patent No.: US 10,187,600 B2
(45) Date of Patent: Jan. 22, 2019

(54) FOUR SHARED PIXEL WITH PHASE DETECTION AND FULL ARRAY READOUT MODES

(71) Applicant: SmartSens Technology (U.S.), Inc., Sshanghai (CN)

(72) Inventors: Yaowu Mo, Shanghai (CN); Zhibin Xiong, Granite Bay, CA (US); Chen Xu, Shanghai (CN); Zexu Shao, Shanghai (CN); Ko Ping Keung, Ma On Shan (HK)

(73) Assignee: SMARTSENS TECHNOLOGY (U.S.), INC., Shanghai (CN)

( * ) Notice: Subject to any disclaimer, the term of this patent is extended or adjusted under 35 U.S.C. 154(b) by 0 days.

(21) Appl. No.: 15/623,786

(22) Filed: Jun. 15, 2017

(65) Prior Publication Data
US 2018/0367747 A1    Dec. 20, 2018

(51) Int. Cl.
*H04N 5/378* (2011.01)
*H04N 9/04* (2006.01)
*H04N 5/374* (2011.01)
*H01L 27/146* (2006.01)

(52) U.S. Cl.
CPC ......... *H04N 5/378* (2013.01); *H01L 27/1461* (2013.01); *H01L 27/14621* (2013.01); *H01L 27/14623* (2013.01); *H01L 27/14627* (2013.01); *H01L 27/14685* (2013.01); *H04N 5/374* (2013.01); *H04N 9/045* (2013.01); *H01L 27/1464* (2013.01)

(58) Field of Classification Search
CPC ........ H04N 5/378; H04N 5/374; H04N 9/045; H01L 27/1461; H01L 27/14621; H01L 27/14623; H01L 27/14627; H01L 27/14685
USPC ......................................... 348/273, 345, 308
See application file for complete search history.

(56) References Cited

U.S. PATENT DOCUMENTS

| | | | |
|---|---|---|---|
| 2010/0230583 A1* | 9/2010 | Nakata | H01L 27/14621 250/227.2 |
| 2013/0063642 A1* | 3/2013 | Nakaoka | H04N 5/3696 348/308 |
| 2013/0229557 A1* | 9/2013 | Hashimoto | H04N 5/3745 348/301 |
| 2014/0176780 A1* | 6/2014 | Koshiba | G02B 7/34 348/336 |
| 2016/0133663 A1* | 5/2016 | Minowa | H01L 27/14607 257/229 |

(Continued)

*Primary Examiner* — Sinh Tran
*Assistant Examiner* — Zhenzhen Wu
(74) *Attorney, Agent, or Firm* — Eric Karich; Karich & Associates (57) ABSTRACT

A pixel cell has four maskless phase detection photodiodes sharing the same readout amplifier, microlens and filter color. The four photodiodes are configured to operate in two adjacent pairs wherein the two adjacent pairs of photodiodes are separated by a light guide and are positioned under the single microlens such that light incident in a first direction is collected in a first pair of photodiodes of the two adjacent pairs of photodiodes and light incident in a second direction is collected in a second pair of photodiodes of the two adjacent pairs of photodiodes. The microlens has a plano-convex shape which causes light to be incident in two directions on photodiodes positioned under each of two sides of the microlens.

7 Claims, 4 Drawing Sheets

(56) References Cited

U.S. PATENT DOCUMENTS

2017/0171470 A1\* 6/2017 Sakioka ............ H01L 27/14627
2017/0257578 A1\* 9/2017 Velichko ........... H01L 27/14629
2018/0077342 A1\* 3/2018 Nakata ................... H04N 9/045

\* cited by examiner

FOUR SHARED PIXEL WITH PHASE DETECTION AND FULL ARRAY READOUT MODES

BACKGROUND OF THE INVENTION

Field of the Invention

This invention relates generally to image sensors, and more particularly to CMOS image sensors with phase detection pixels to perform autofocus. The phase detection pixels are maskless and consist of four photodiodes sharing the same readout amplifier, microlens and filter color. The image sensor may be incorporated within a digital camera.

Description of Related Art

An image capture device includes an image sensor and an imaging lens. The imaging lens focuses light onto the image sensor to form an image, and the image sensor converts the light into electrical signals. The electrical signals are output from the image capture device to other components of a host electronic system. The image capture device and the other components of a host electronic system form an imaging system. Image sensors have become ubiquitous and may be found in a variety of electronic systems, for example a mobile device, a digital camera, a medical device, or a computer.

A typical image sensor comprises a number of light sensitive picture elements ("pixels") arranged in a two-dimensional array. Such an image sensor may be configured to produce a color image by forming a color filter array (CFA) over the pixels. The technology used to manufacture image sensors, and in particular, complementary metal-oxide-semiconductor ("CMOS") image sensors, has continued to advance at great pace. For example, the demands of higher resolution and lower power consumption have encouraged the further miniaturization and integration of these image sensors. However, miniaturization has come with the loss of pixel photosensitivity and dynamic range which require new approaches in order to mitigate.

With the decreased pixel size, the total light absorbed within the pixel becomes diminished and some advanced features such as phase difference detection autofocus become challenged. In phase difference detection autofocus technology it is known to use pixels comprising two half masked photodiodes, each under nearby respective microlenses, wherein the single photodiodes in each pixel receive light from nearby points on the object but arriving at different angles. When masked photodiode pixels are used and when a scene is out of focus the phase detection photodiode mask phase shifts the light slightly. The distance between a pair of phase detection pixels, combined with their relative shifts, can be used to calculate how far an optical assembly needs to move a lens element to bring the scene into focus. Partially masking a photodiode of decreased size further reduces pixel signal with no decrease in signal noise, thereby reducing signal to noise. An improved phase difference detection autofocus technology uses maskless phase detection pixels. In maskless phase difference detection autofocus technology it is known to place two adjacent photodiodes under a single microlens for sensing light from a point in a scene from two different angles. A monochrome color filter is configured to extend over both of the adjacent photodiodes so that both receive the same wavelength of light. The two adjacent photodiodes are positioned under the single microlens such that light incident in a first direction is collected in a first photodiode of the two adjacent photodiodes and light incident in a second direction is collected in a second photodiode of the two adjacent photodiodes. An image signal processor may perform phase detection autofocus using values received from the two adjacent photodiodes.

An opportunity for improvement of maskless phase detection autofocus combined with increased image sensor resolution arises when autofocus readout and full resolution readout are conducted separately and with different combinations of shared photodiodes within a pixel. The present invention fulfills these needs and provides further advantages as described in the following summary.

SUMMARY OF THE INVENTION

The present invention teaches certain benefits in construction and use which give rise to the objectives described below.

The present invention provides an imaging system comprising an array of pixel cells, each pixel cell comprising four maskless phase detection photodiodes sharing the same readout amplifier, microlens and filter color. The four photodiodes are configured to operate in two adjacent pairs wherein the two adjacent pairs of photodiodes are positioned under the single microlens such that light incident in a first direction is collected in a first pair of photodiodes of the two adjacent pairs of photodiodes and light incident in a second direction is collected in a second pair of photodiodes of the two adjacent pairs of photodiodes. The microlens has a plano-convex shape which causes light to be incident in two directions on photodiodes positioned under each of two sides of the microlens. The pixel also comprises a light guide structure located within the color filter between the first and second pairs of photodiodes.

A primary objective of the present invention is to provide an image sensor pixel having advantages not taught by the prior art.

It is known in the prior art to configure two adjacent photodiodes under a single microlens and filter but image sensor resolution becomes limited as photodiode size decreases and discrimination between the signals from the adjacent photodiodes becomes inadequate for effective autofocus functioning. An objective of the present invention is to configure four photodiodes under the same microlens and filter and to bin or combine the signals from photodiodes within pairs of the photodiodes during autofocus to improve autofocus function while also providing for increased image sensor imaging resolution when an autofocus function is not selected and binning of signals is not selected.

Another objective is to provide a pixel cell that comprises photodiodes of reduced area in order to increase image sensor array resolution capability.

An additional objective of the present is to provide a pixel cell that provides for an image sensor capable of providing autofocus information derived from the entire sensor array rather than a limited number of strategically placed photodiode pairs throughout the array.

Other features and advantages of the present invention will become apparent from the following more detailed description, taken in conjunction with the accompanying drawings, which illustrate, by way of example, the principles of the invention.

BRIEF DESCRIPTION OF THE DRAWINGS

The accompanying drawings illustrate the present invention. In such drawings.

DETAILED DESCRIPTION OF THE INVENTION

The above-described drawing figures illustrate the invention, an imaging system comprising pixel cells, each comprising four maskless phase detection photodiodes sharing the same readout amplifier, microlens and filter color. Various embodiments of the pixel cell are disclosed herein. In the following description, numerous specific details are set forth in order to provide a thorough understanding of the present invention. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects. A substrate may have a front side and a back side. Any fabrication process that is performed from the front side may be referred to as a frontside process while any fabrication process that is performed from the back side may be referred to as a backside process. Structures and devices such as photodiodes and associated transistors may be formed in a front surface of a substrate. A dielectric stack that includes alternating layers of metal routing layers and conductive via layers may be formed on the front surface of a substrate. In a stacked chip arrangement the front sides of two chips may be directly coupled since the electrical interconnects on each chip will most commonly be formed on the front sides of each chip. When reference is made to certain circuit elements residing within or formed in a substrate this is generally accepted to mean the circuits reside on the front side of the substrate.

Figure 1:
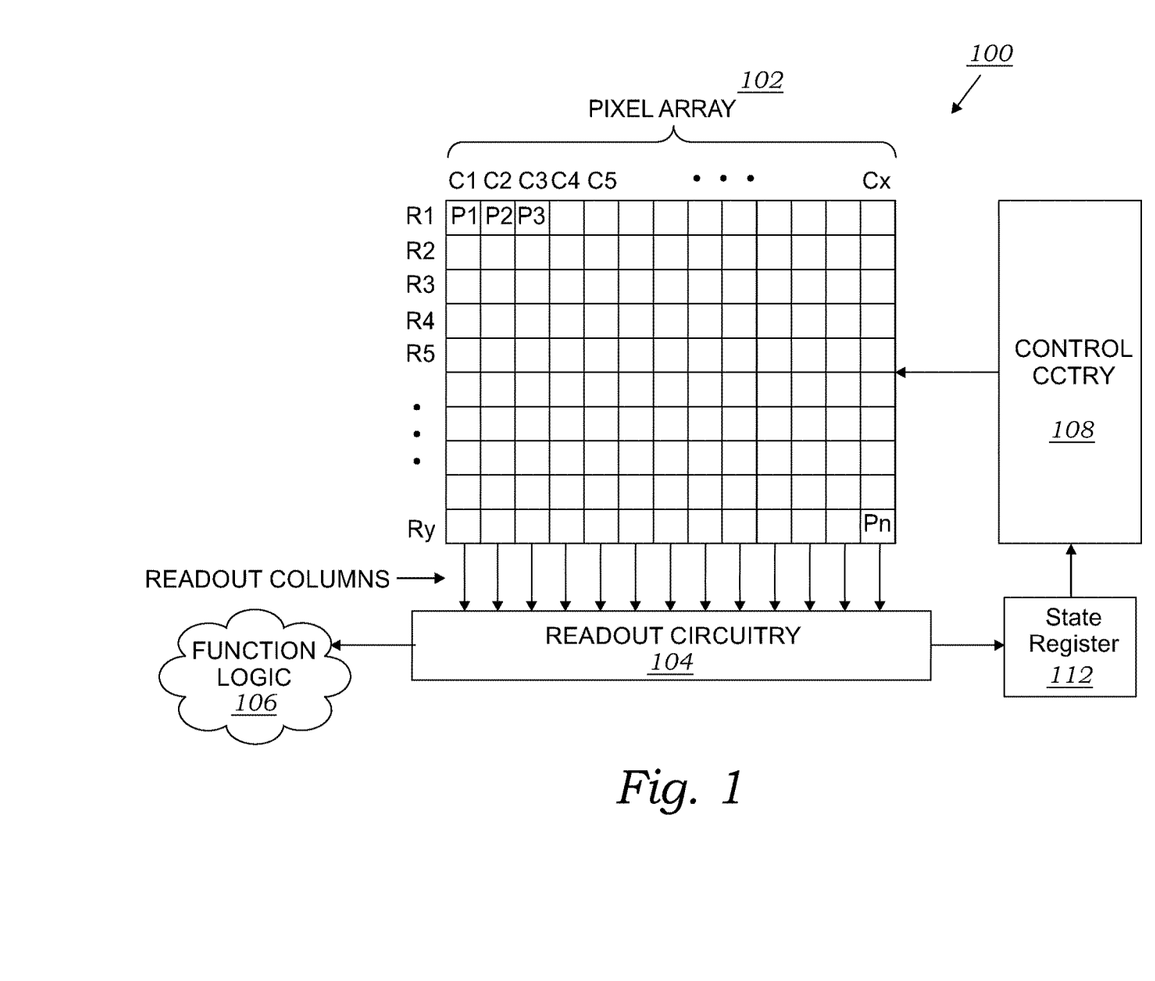
FIG. 1 is a diagram illustrating one example of an imaging system including a pixel array having pixel cells included in an integrated circuit system according to one embodiment of the present invention.

FIG. 1 is a diagram illustrating one example of an imaging system 100 including an example pixel array 102 having a plurality of image sensor pixel cells included in an example integrated circuit system with features in accordance with the teachings of the present invention. As shown in the depicted example, imaging system 100 includes pixel array 102 coupled to control circuitry 108 and readout circuitry 104, which is coupled to function logic 106. Control circuitry 108 and readout circuitry 104 are in addition coupled to state register 110. In one example, control circuitry 108 is coupled to pixel array 102 to control operational characteristics of pixel array 102. Some aspects of the operation of control circuitry 108 may be determined by settings present in state register 110. In one example, pixel array 102 is a two-dimensional (2D) array of image sensor pixels (e.g., pixels P1, P2 ..., Pn).

As illustrated in FIG. 1, each pixel may be arranged into a row (e.g., rows R1 to Ry) and a column (e.g., column C1 to Cx) to acquire image data of a person, place, object, etc., which can then be used to render a 2D image of the person, place, object, etc. In one example, after each pixel has acquired its image data or image charge, the image data is readout by readout circuitry 104 using a readout mode specified by state register 110 and then transferred to function logic 106. In various examples, readout circuitry 104 may include amplification circuitry, analog-to-digital (ADC) conversion circuitry, or otherwise. In one example of the present invention, state register 110 may include a digitally programmed selection system to determine whether readout mode is for an autofocus function or a full resolution imaging function.

Function logic 106 may simply store the image data or even manipulate the image data by applying post image effects (e.g., crop, rotate, remove red eye, adjust brightness, adjust contrast, or otherwise). For example, control circuitry 108 may generate a shutter signal for controlling image acquisition. In one example, the shutter signal is a global shutter signal for simultaneously enabling all pixels within pixel array 102 to simultaneously capture their respective image data during a single acquisition window. In another example, the shutter signal is a rolling shutter signal such that each row, column, or group of pixels is sequentially enabled during consecutive acquisition windows. In one example of the present invention, control circuitry 108 and readout circuitry 104 may generate and readout a row of image data containing phase detection autofocus related signals which are processed by suitable function logic to provide autofocus functions to an imaging system. In an example of the present invention control circuitry 108 may generate control signals to combine or bin image signals from photodiodes arranged in pairs for use in a phase detection autofocus function. In another example of the present invention control circuitry 108 may generate control signals to capture image signals from each photodiode without combination or binning for use in providing a full resolution image from the image array.

Figure 2:
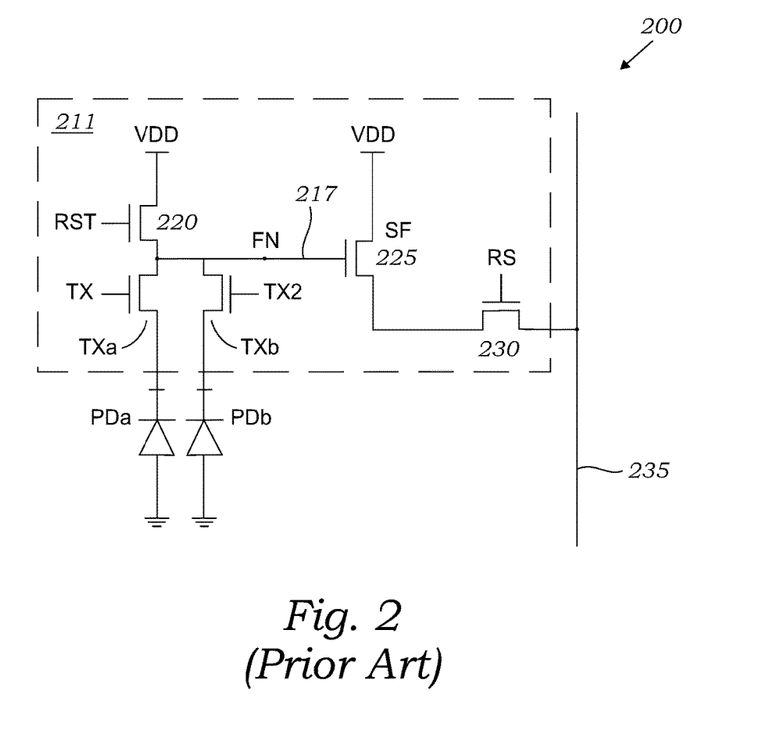
FIG. 2 is an electrical schematic that illustrates one example of an image sensor pixel cell with one phase detection photodiode found in the prior art.

FIG. 2 is an electrical schematic that illustrates an image sensor pixel cell from the prior art, with shared phase detection photodiodes with rolling shutter readout. This figure and example pixel are provided to simplify explanation of pixel operation in anticipation of a description of an example of the present invention. Each sensor pixel 200 includes a photodiode PDa (e.g., photosensitive element) and a photodiode PDb and pixel support circuitry 211 as shown. Photodiodes PDa and PDb may be "pinned" photodiodes as is commonly present in CMOS image sensors. In one example, pixel support circuitry 211 includes a reset transistor 220, a row select transistor 230, and a source follower (SF) amplifier transistor 225 coupled to transfer transistors TXa and TXb which control their respective photodiodes PDa and PDb. During operation, photodiode PDa photo-generates charge in response to light incident from a first direction during an exposure period. Transfer transistor TXa is coupled to receive a transfer signal TX1, which causes transfer transistor TXa to transfer the charge accumulated in photodiode PDa to floating diffusion (FN) node 217. In a separate sequence photodiode PDb photo-generates charge in response to light incident from a second direction during an exposure period. Transfer transistor TXb is coupled to receive a transfer signal TX2, which causes transfer transistor TXb to transfer the charge accumulated in photodiode PDb to floating diffusion (FN) node 217. Floating diffusion 217 is in effect the drain of the transfer transistors while the photodiodes are the source of transfer transistors.

In one embodiment transfer transistor TXb is a metal-oxide semiconductor field-effect transistor (MOSFET), although alternative elements known in the art may also be utilized. Reset transistor 220 is coupled between power rail VDD and floating diffusion node 217 to reset sensor pixel 200 (e.g., discharge or charge floating diffusion node 217 and photodiodes PDa and PDb to a preset voltage) in response to a reset signal RST. Floating diffusion node 217 is coupled to control the gate terminal of source-follower (SF) transistor 225. Source-follower transistor 225 is coupled between power rail VDD and row select (RS) transistor 230 to amplify a signal responsive to the charge on the floating diffusion FN node 217. Row select transistor 230 couples the output of pixel circuitry from the source-follower transistor 225 to the readout column, or bit line 235, in response to a row select signal RS. Floating diffusion node 217 photodiodes PDa and PDb are (separately or together) reset by temporarily asserting the reset signal RST and transfer signals TX1 and TX2 (separately or together).

The accumulating window (e.g., exposure period) begins when the transfer signals TXa and TXb are (separately or together) de-asserted, which permits incident light to photo-generate charge in photodiode 210. As photo-generated electrons accumulate in a photodiode, its voltage decreases (electrons are negative charge carriers). The voltage or charge on the photodiode is representative of the intensity of the light incident on the photodiode during the exposure period. At the end of the exposure period, the reset signal RST is de-asserted, which turns off the reset transistor 220 and isolates floating diffusion FN node 217 from VDD. The transfer signal TX is then asserted to couple photodiode 210 to floating diffusion node 217. The charge is transferred from the photodiode to the floating diffusion FN node 217 through the transfer transistor, which causes the voltage of floating diffusion FN node 217 to drop by an amount proportional to photo-generated electrons accumulated on the photodiode during the exposure period.

In the case of the prior art example of an image sensor pixel cell with shared phase detection photodiodes illustrated in FIG. 2, the signals generated from image charges generated by photodiodes PDa and PDb may be read out in sequence and compared off-pixel to determine a difference related to the difference in incident light direction on each of the photodiodes. Such information is useful in performing an autofocus function in the imaging system.

Figure 3A:
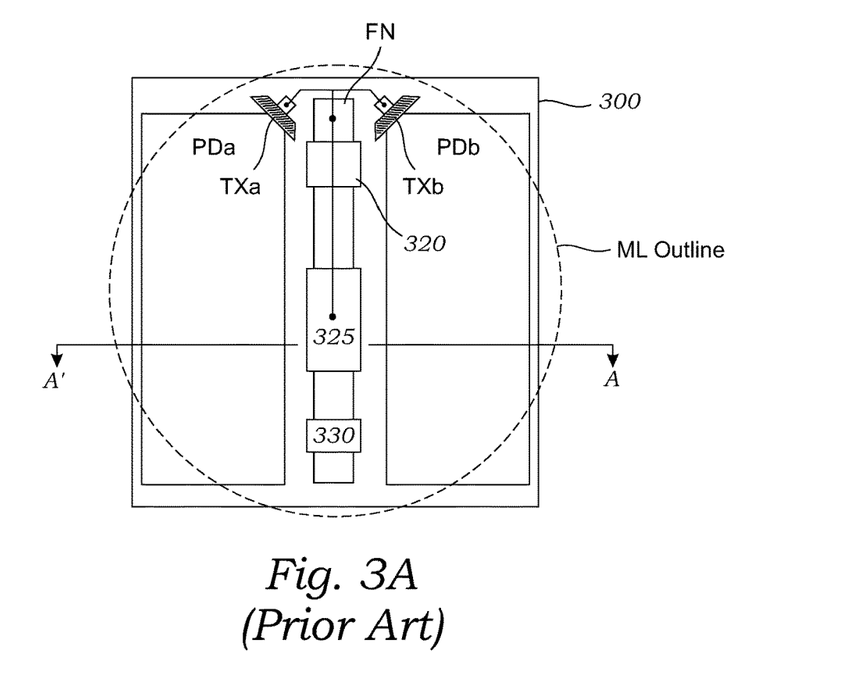
FIG. 3A is a diagram illustrating a prior art pixel cell layout wherein a pair of adjacent maskless phase difference photodiodes share the same microlens.
Figure 3B:
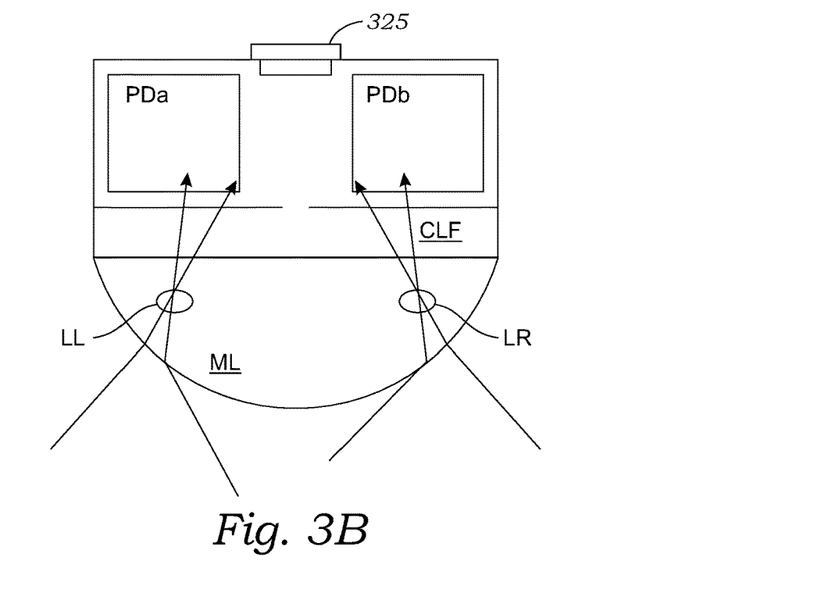
FIG. 3B is a cross section diagram of the prior art pixel cell shown in FIG. 3A.

FIG. 3A is a diagram illustrating a front side view of a pixel cell layout that may be used to fabricate image sensor pixel cell 300 with shared phase detection photodiodes as illustrated in FIG. 2. FIG. 3B is a cross section diagram of pixel cell 300 shown in FIG. 3A along its cross section line AA'. Photodiodes PDa and PDb and transfer transistors TXa and TXb correspond in kind to the photodiodes denoted as photodiodes PDa and PDb in FIG. 2 and the transfer transistors denoted as TXa and TXb in FIG. 2. Reset transistor 320, SF transistor 325 and row select transistor 330 shown in FIG. 3 correspond to reset transistor 220, SF transistor 225 and row select transistor 230 shown in FIG. 2. FIGS. 3A and 3B illustrate a backside illuminated (BSI) pixel wherein incident light enters the photodiodes through a backside of the substrate in which the photodiodes are formed after passing through a microlens ML and color filter CLF disposed on the backside of the substrate. A suitable alternate example, although not shown, is a frontside illuminated pixel wherein incident light enters the photodiodes through a frontside of the substrate in which the photodiodes are formed after passing through a microlens ML and color filter CLF disposed on the frontside of the substrate. Also illustrated in FIG. 3B is incident light LR entering photodiode PDb at first incident angles through the right side of microlens ML and incident light LL entering photodiode PDa at second incident angles through the left side of microlens ML. As described in regard to FIG. 2 the signals generated from image charges generated by photodiodes PDa and PDb shown in FIG. 3 may be read out in sequence and compared off-pixel to determine a difference related to the difference in incident light direction on each of the photodiodes. Such information is useful in performing an autofocus function in the imaging system.

Figure 4A:
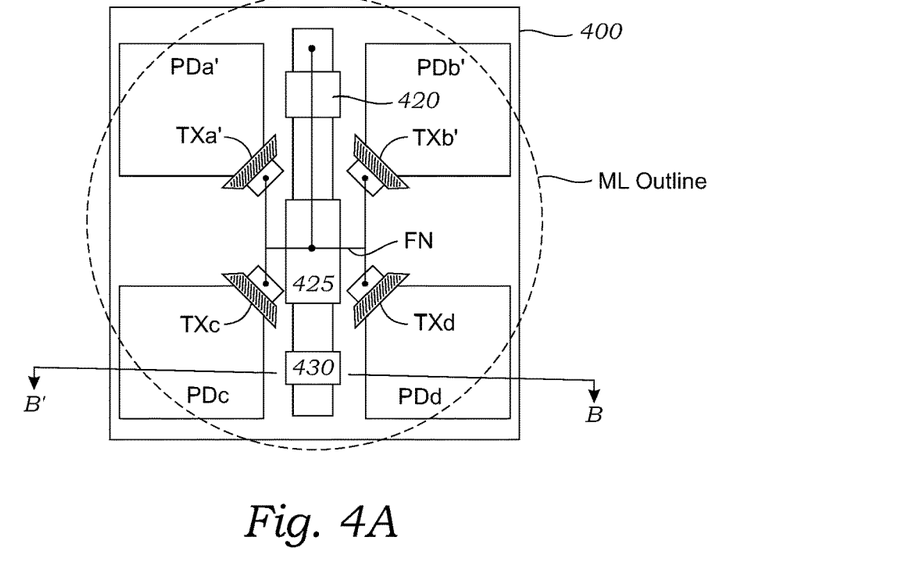
FIG. 4A is a diagram illustrating an embodiment of the invention, a pixel cell layout wherein four maskless phase difference photodiodes share the same microlens.
Figure 4B:
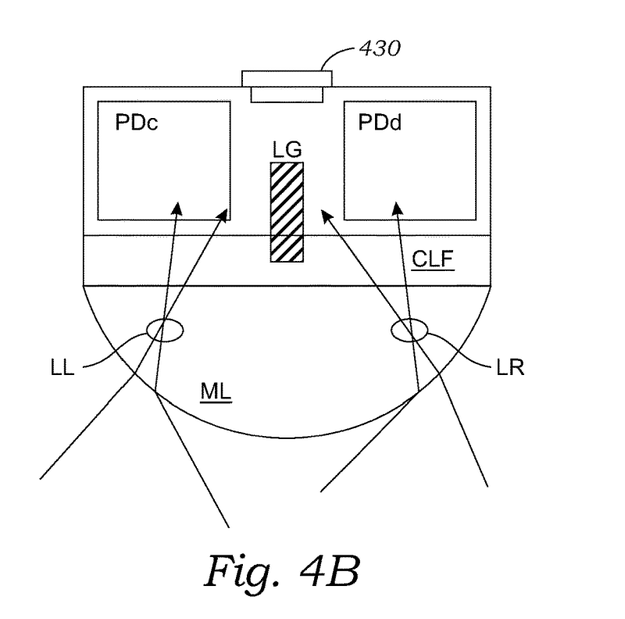
FIG. 4B is a cross section diagram of the prior art pixel cell shown in FIG. 4A.

FIG. 4A is a diagram illustrating a pixel cell 400 in accordance with a first embodiment of the invention. FIG. 4A illustrates pixel cell 400 includes a two by two configuration of four photodiodes PDa', PDb', PDc, PDd and respective MOSFET transfer transistors TXa', TXb', TXc, TXd and commonly coupled floating drain FN located on the frontside of a semiconductor substrate of an image sensor wafer. Reset transistor 420, SF transistor 425 and row select transistor 430 are included in the illustration and are required to provide image signals representative of a target scene to an imaging system. FIG. 4B is a cross section diagram of pixel cell 400 shown in FIG. 4A along its cross section line BB'. FIGS. 4A and 4B illustrate a backside illuminated (BSI) pixel wherein incident light enters the photodiodes through a backside of the substrate in which the photodiodes are formed after passing through a microlens ML and color filter CLF disposed on the backside of the substrate. A suitable alternate example, although not shown, is a frontside illuminated pixel wherein incident light enters the photodiodes through a frontside of the substrate in which the photodiodes are formed after passing through a microlens ML and color filter CLF disposed on the frontside of the substrate.

Also illustrated in FIG. 4B is incident light LR entering photodiode PDd at first incident angles through the right side of microlens ML and incident light LL entering photodiode PDc at second incident angles through the left side of microlens ML. Incident light LR and LL are to an extent prevented from entering photodiodes PDc and PDd respectively by light guide LG which is configured to lie between the vertically adjacent pair PDa' and PDc and the vertically adjacent pair PDb' and PDd. Light guide LG may be formed of a metal such as Tungsten or Aluminum and it may extend from within color filter CLF into the substrate region between the photodiodes.

Pixel cell 400 of FIG. 4A illustrates only the pixel related components residing on a sensor chip. Pixel cell 400 is repeated to form the rows and columns of an imaging array. A sensor chip may contain additional peripheral circuits as need to functionalize the imaging array portion of the image sensor, for example, electrical wiring to carry reset and transfer transistor gate electrode control signals to all the pixel cells. The invented imaging system may also comprise control circuitry and readout circuitry and a state register configured to operate the control and readout circuitry.

Photodiodes PDa', PDb', PDc, and PDd may be of an identical size and positioned for example in a two by two array as shown. Typically the sizes and placements of the photodiodes within pixel cell 400 are chosen such that an array of pixel cells 400 will result in all of the photodiodes of the assembled array falling on a uniform grid. In the instance pixel cell 400 is employed to form a color image sensor, light filters of various colors may be placed at each pixel cell location within the incident light path. A commonly known two by two arrangement of light filters is a Bayer filter pattern which consists of a red, a blue and two green filters (RGGB). Pixel circuitry residing within pixel cell 400 is constrained to occupy the space between the photodiodes.

The following are non-limiting examples of some features and embodiments of the invented pixel cell shown in FIG. 4A. The wavelengths of light that color filter CLF is configured to pass may correspond to green or red or blue. However all four of the photodiodes configured under the single microlens ML are covered with the same type color filter. Four of the invented pixel cells arranged two by two can form a Bayer color filter pattern useful in color image sensing. The single microlens ML covering the four photodiodes of the invented pixel cell may be a plano-convex lens. The four photodiodes of the invented pixel cell share a common floating drain, reset transistor, amplifier transistor and row select transistor. Since they all have separate and independent transfer transistors each photodiode may be read out independently and therefore the imaging system resolution may be as high as the number of photodiodes. The number of photodiodes present in the invented phase detection pixel cell is double that of the cited prior art phase detection pixel cell albeit the photodiodes present in the invented phase detection pixel cell are less than half the size of the photodiodes of the cited prior art phase detection pixel cell. The invented phase detection pixel cell performs phase detection by binning or combining two photodiodes forming a first vertically adjacent pair of the four photodiodes under the right side of the microlens and by binning two photodiodes forming a second vertically adjacent pair of the four photodiodes under the left side of the microlens. The four share configuration facilitates the described binning since for example transfer transistors TXa' and TXc may be simultaneously activated and then deactivated resulting in the sum of image charges from both photodiodes being passed on as a combined image signal to the readout circuitry. Likewise transfer transistors TXb' and TXd may be simultaneously activated and then deactivated resulting in the sum of image charges from both photodiodes being passed on as a combined image signal to the readout circuitry. If the photodiodes were not binned and only image charge from single photodiodes were used for phase detection the diminished size of the photodiodes would likely not provide enough image signal to discriminate the needed difference information. Whether the image sensor is in a full resolution read out mode with no phase detection or a phase detection mode wherein pairs of vertically adjacent sets of photodiodes are binned to provide phase detection information may be determined by the state of a state register setting in a state register component of the imaging system. A novel aspect of the invention is the capability of the imaging system to be readout either in a phase difference detection mode to produce an autofocus function on a target scene or a full resolution mode wherein all pixels are read to produce a full resolution image of a target scene.

Reference throughout this specification to "one embodiment," "an embodiment," "one example," or "an example" means that a particular feature, structure, or characteristic described in connection with the embodiment or example is included in at least one embodiment or example of the present invention. Thus, the appearances of the phrases such as "in one embodiment" or "in one example" in various places throughout this specification are not necessarily all referring to the same embodiment or example. Furthermore, the particular features, structures, or characteristics may be combined in any suitable manner in one or more embodiments or examples. Directional terminology such as "top", "down", "above", "below" are used with reference to the orientation of the figure(s) being described. Also, the terms "have," "include," "contain," and similar terms are defined to mean "comprising" unless specifically stated otherwise. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

The above description of illustrated examples of the present invention, including what is described in the Abstract, are not intended to be exhaustive or to be limited to the precise forms disclosed. While specific embodiments of, and examples for, the invention are described herein for illustrative purposes, various equivalent modifications are possible without departing from the broader spirit and scope of the present invention. Indeed, it is appreciated that the specific example structures and materials are provided for explanation purposes and that other structures and materials may also be employed in other embodiments and examples in accordance with the teachings of the present invention. These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation.

What is claimed is:

1. An imaging system comprising: an array of pixel cells, each pixel cell comprising:

a two by two configuration of four photodiodes and four respective associated transfer transistors, for sensing incident light from a target scene, the transfer transistors sharing a floating diffusion coupled to a reset transistor and also coupled through an amplifier transistor to a row select transistor for providing from each of the photodiodes electrical signals representative of the target scene;

a color filter with a same color disposed over the four photodiodes;

a single plano-convex microlens disposed over the color filter and the four photodiodes such that the incident light from the target scene incident on the plano-convex microlens is directed in a first direction toward two of the four photodiodes forming a first vertically adjacent pair of the four photodiodes and directed in a second direction toward the remaining two photodiodes forming a remaining second vertically adjacent pair of the four photodiodes; and the imaging system further comprising a control and readout circuit and a state register controller configured to operate the control and readout circuitry in either a first phase difference detection mode wherein the electrical signals from the first vertically adjacent pair of photodiodes are combined and compared to combined electrical signals from the second vertically adjacent pair of photodiodes and readout to provide an autofocus function related to the target scene or in a second full resolution mode wherein the image electrical signals from every photodiode is readout without binning to form a full resolution image of the target scene.

2. The imaging system of claim 1 wherein each pixel cell comprises a light guide structure located within the color filter between the first and second vertically adjacent pairs of photodiodes.

3. The imaging system of claim 1 wherein in the first phase difference detection mode of the control and readout circuit, the electrical signals from each of the photodiodes in the first vertically adjacent pair of the four photodiodes is combined in a binning operation.

4. The imaging system of claim 1 wherein in the first phase difference detection mode of the control and readout circuit, the electrical signals from each of the photodiodes in the second vertically adjacent pair of the four photodiodes is combined in a binning operation.

5. The imaging system of claim 1 wherein each pixel cell resides within a substrate comprising a front surface and a back surface and wherein each pixel is configured to receive the incident light from the target scene through the back surface of the substrate.

6. The imaging system of claim 1 wherein each pixel cell resides within a substrate comprising a front surface and a back surface and wherein each pixel is configure to receive the incident light from the target scene through the front surface of the substrate.

7. A method for providing an optionally selectable autofocus function mode or full resolution imaging mode for an array of pixel cells, the method comprising the steps of:

providing a first semiconductor substrate comprising an array of pixel cells, each pixel cell comprising a set of four transfer transistors, each of the transfer transistors coupled to respective photodiodes and sharing floating drains, a reset transistor and an amplifier transistor;

providing a single color filter over the four transfer transistors and their respective four photodiodes;

providing a single plano-convex micro lens;

positioning the microlens over the single color filter and the four photodiodes such that light from a target scene incident on the plano-convex microlens is directed in a first direction toward two of the four photodiodes which form a first vertically adjacent pair of the four photodiodes and is directed in a second direction toward the remaining two photodiodes of the four photodiodes forming a second vertically adjacent pair of photodiodes;

providing a light guide structure located within the color filter between the first and second vertically adjacent pairs of photodiodes;

providing a control and readout circuit and a state register controller configured to operate the control and readout circuit in either a first phase difference detection mode wherein electrical signals from the first vertically adjacent pair of photodiodes are combined and compared to combined electrical signals from the second vertically adjacent pair of photodiodes and readout to provide an autofocus function related to the target scene or to operate the control and readout circuit in a second full resolution mode wherein the electrical signals from every photodiode is readout to form a full resolution image of the target scene; and focusing the light from the target scene onto the array of pixel cells and selecting a configuration of the state register to either operate the array of pixel cells in the first phase difference detection mode to provide an autofocus function or in the second full resolution mode to form the full resolution image of the target scene.

* * * * *